United States Patent
Li et al.

(10) Patent No.: US 11,469,730 B2
(45) Date of Patent: Oct. 11, 2022

(54) CIRCUITS AND METHODS FOR MAINTAINING GAIN FOR A CONTINUOUS-TIME LINEAR EQUALIZER

(71) Applicant: QUALCOMM Incorporated, San Diego, CA (US)

(72) Inventors: Miao Li, San Diego, CA (US); Li Sun, Irvine, CA (US); Hao Liu, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 114 days.

(21) Appl. No.: 17/099,183

(22) Filed: Nov. 16, 2020

(65) Prior Publication Data
US 2021/0175868 A1    Jun. 10, 2021

Related U.S. Application Data

(60) Provisional application No. 62/944,817, filed on Dec. 6, 2019.

(51) Int. Cl.
*H03F 3/04* (2006.01)
*H03G 5/16* (2006.01)
(Continued)

(52) U.S. Cl.
CPC ............... *H03G 5/165* (2013.01); *H03F 3/04* (2013.01); *H03G 3/30* (2013.01); *H03F 1/302* (2013.01); *H03G 2201/103* (2013.01)

(58) Field of Classification Search
CPC .... H03G 5/165; H03G 3/30; H03G 2201/103; H03G 5/28; H03G 1/0029; H03G 3/3042;
(Continued)

(56) References Cited

U.S. PATENT DOCUMENTS 6,194,967 B1 * 2/2001 Johnson .................. G05F 3/262
330/288
6,815,941 B2 * 11/2004 Butler ....................... G05F 3/30
323/901

(Continued)

FOREIGN PATENT DOCUMENTS

GB    2533309 A    6/2016

OTHER PUBLICATIONS

Farjad-Rad R., et al., "0.622-8.0 Gbps 150mW Serial IO Macrocell with Fully Flexible Preemphasis and Equalization", 2003 Symposium on VLSI Circuits, Digest Technical Papers, Kyoto, Japan, Jun. 12, 2003, [Symposium on VLSI Circuits], New York, NY, IEEE, US, Jun. 2003 (Jun. 12, 2003), XP032413929, pp. 63-66, 10.1109/VLSIC.2003.1221162 ISBN: 978-4-89114-034-2 p. 63-p. 66, figures 1-6.
International Search Report and Written Opinion—PCT/US2020/061900—ISA/EPO—dated Mar. 5, 2021.

(Continued)

*Primary Examiner* — Khanh V Nguyen
(74) *Attorney, Agent, or Firm* — Haynes and Boone, LLP

(57) ABSTRACT

A bias structure includes a reference voltage node connected to gate structures of a first NMOS transistor and a second NMOS transistor, a bias voltage node comprising a bias voltage, and a first op amp having a first input connected to the reference voltage, a second input connected to a drain of the first NMOS transistor, and an output connected to gate structures of a first PMOS transistor and a second PMOS transistor. The bias structure further includes a second op amp having a first input connected to the reference voltage, a second input connected to a drain of the second NMOS transistor, and an output connected to a gate structure of a third NMOS transistor and the bias voltage node. The first NMOS transistor matches a transistor of a differential pair of an integrated circuit device.

26 Claims, 8 Drawing Sheets

(51) Int. Cl.
*H03G 3/30* (2006.01)
*H03F 1/30* (2006.01)

(58) Field of Classification Search
CPC ..... H03G 3/3047; H03F 3/04; H03F 3/45197; H03F 3/45475; H03F 2200/453; H03F 2200/555; H03F 2203/45244; H03F 2203/45286; H03F 2203/45288; H03F 2203/45424; H03F 2203/45434; H03F 3/45636; H03F 1/301; H03F 1/302; H03F 2200/18; H03F 1/0261; H04L 25/0272; H04L 25/0292; H04L 25/0294; H04L 25/03878
USPC ......................................... 330/273, 285, 296

See application file for complete search history.

(56) References Cited

U.S. PATENT DOCUMENTS

| | | |
|---|---|---|
| 7,633,346 B2 * | 12/2009 | Oishi ................... H03F 1/301 330/296 |
| 8,200,179 B1 | 6/2012 | Mosinskis et al. |
| 10,613,570 B1 * | 4/2020 | Codega .................. G05F 3/262 |
| 2009/0224836 A1 | 9/2009 | Orberk et al. |

OTHER PUBLICATIONS

Talebbeydokhti N., et al., "Constant Transconductance Bias Circuit with an on-Chip Resistor", 2006 IEEE International Symposium on Circuits and Systems May 21-24, 2006 Island of KOS, Greece, IEEE—Piscataway, NJ, USA, May 21, 2006 (May 21, 2006), XP032458343, pp. 2857-2860, DOI: 10.1109/ISCAS.2006. 1693220 ISBN: 978-0-7803-9389-9 paragraph [000I]—paragraph [000V], figures 1-7.

* cited by examiner

CIRCUITS AND METHODS FOR MAINTAINING GAIN FOR A CONTINUOUS-TIME LINEAR EQUALIZER

CROSS-REFERENCE TO RELATED APPLICATIONS

The present application claims the benefit of U.S. Provisional Patent Application No. 62/944,817, filed Dec. 6, 2019, the disclosure of which is incorporated by reference herein in its entirety.

TECHNICAL FIELD

The present application relates, generally, to data receivers and, more specifically, to data receivers having analog equalizers.

BACKGROUND

Differential signal processing circuits, such as variable gain amplifiers (VGAs) and continuous time linear equalizers (CTLEs), receive and apply a particular frequency-dependent gain to an input differential signal to generate an output differential signal. The input differential signal is typically received at control terminals (e.g., gates) of input transistors (e.g., field effect transistors (FETs)), and the output differential signal are generated at other terminals (e.g., drains) of the input transistors.

The effective direct current (DC) voltage level of a differential signal is generally referred to as the common mode voltage. The common mode voltage is generally the average voltage between the voltage levels of the positive and negative components of the differential signal. The common mode voltage affects the operating point of the devices to which the differential signal is applied. If the common mode voltage varies, the operating point of the devices varies, which may have undesirable consequences.

In the context of a differential signal processing circuit, the input differential signal applied to the input transistors may have a common mode voltage that varies for a number of reasons. The gain applied to the input differential signal by the differential signal processing circuit results in an output differential signal that has a common mode voltage that varies with the common mode voltage of the input differential signal. In addition, process variation of the differential signal processing circuit itself may cause common mode voltage variation. As a result, the input transistors are subjected to varying common mode voltage levels, which has the adverse consequence of reducing gain and peaking control for the differential signal processing circuit. Additionally, the varying common mode voltage of the output differential signal may adversely affect the operation of one or more devices downstream of the differential signal processing circuit.

SUMMARY

According to one implementation, a receiver circuit includes: an analog equalizer including a first transistor in series with a first resistor and with a first current source; and a bias circuit including a second transistor in series with a second current source, the bias circuit further including a second resistor between the second current source and a third transistor, a first operational amplifier (op amp) having a first input coupled to a gate of the second transistor and a second input coupled to a source of the third transistor, a second op amp having a third input coupled to a gate of the second transistor and a fourth input coupled to a drain of the second transistor, an output of the second op amp providing a gate voltage to the first current source and to the second current source According to one implementation, a method for operating an equalizer circuit includes: at a first bias circuit having a first transistor and a second transistor arranged in separate legs of a current mirror, maintaining a drain voltage of the first transistor and a drain voltage of the second transistor equal to a gate voltage of the first transistor; generating a current by a first current source in series with legs of the current mirror, wherein a gate voltage of the first current source is provided by a first operational amplifier (op amp) disposed between a gate of the first transistor and a drain of the second transistor; and applying the gate voltage to a second current source within the equalizer circuit.

According to another implementation, a semiconductor chip includes: a first bias circuit having a first transistor and a second transistor arranged in a first current mirror, the first bias circuit further having a first current source coupled to the first transistor and the second transistor, the first bias circuit further having a first operational amplifier (op amp) coupled to a drain of the second transistor and a gate of the first transistor and coupled to output a first bias voltage to a gate of the first current source; a second bias circuit having a second op amp coupled to output a second bias voltage to a gate of a third transistor; and an equalizer circuit having a fourth transistor and a fifth transistor are arranged in a second current mirror, the fourth transistor being in series with a second current source, the second current mirror coupled to a power rail by a sixth transistor, wherein the second current source is coupled to the first bias voltage, and wherein the sixth transistor is coupled to the second bias voltage.

According to another implementation, a data receiver in a semiconductor chip, the data receiver including: means for reshaping a differential data signal, including applying a gain to the differential data signal, wherein the gain equals a transconductance of a first transistor times a resistance; means for adjusting a current through the first transistor, including means for applying a bias voltage to a current source in the reshaping means, wherein the bias voltage applying means includes: a second transistor and a third transistor arranged in a current mirror architecture; and a first operational amplifier (op amp) coupled to a drain of the second transistor and to a gate of the third transistor and having a feedback loop configured to adjust the bias voltage; and means for deserializing the differential data signal.

According to another implementation, a bias structure includes: a reference voltage node connected to gate structures of a first NMOS transistor and a second NMOS transistor; a bias voltage node comprising a bias voltage; a first op amp having: a first input connected to the reference voltage; a second input connected to a drain of the first NMOS transistor; and an output connected to gate structures of a first PMOS transistor and a second PMOS transistor; and a second op amp having: a first input connected to the reference voltage; a second input connected to a drain of the second NMOS transistor; an output connected to a gate structure of a third NMOS transistor and the bias voltage node; wherein the first NMOS transistor matches a transistor of a differential pair of an integrated circuit device.

DETAILED DESCRIPTION

Figure 1:
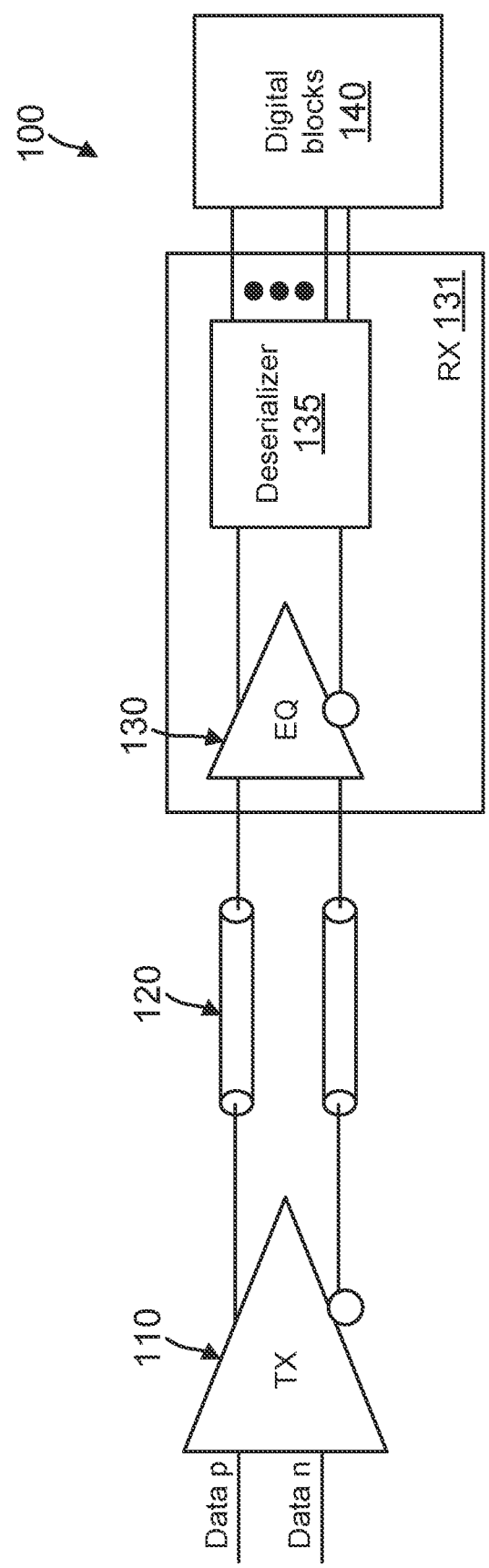
FIG. 1 is an illustration of an example data transmitting and receiving circuit, according to one implementation.

According to principles described herein, improvements are made to a continuous time linear equalizer (CTLE) in order to improve the consistency of the gain and common-mode voltage at various process, voltage, temperature (PVT) corners. Integrated circuits are subject to variations that affect how well the circuit functions. For example, fabrication processes may vary slightly when fabricating an integrated circuit. And, sometimes the circuit may operate over a range of voltages and temperatures. Each of these varying conditions may affect how the circuit performs. The extreme ends of these process variations may be referred to as PVT corners. It is desirable that circuits perform well at different PVT corners (in other words, under different conditions).

The CTLE described herein may be used, for example, as part of a serial-deserializer (SerDes) receiver. A CTLE plays a role to counteract channel loss in a SerDes circuit. For a specific channel, the loss may be fixed for specific frequencies of interest. However, for some traditional CTLEs, gain varies over PVT corners at both low frequency and high frequency of interest, like Nyquist frequency (for example, 10 GHz for 20-Gb/s data rate). This gain variation may be costly to deal with and adversely affect circuit performance. A mechanism to keep the CTLE gain constant at different PVT corners is desired.

Some methods utilize a constant transconductance times resistance (gm*R) structure to generate a bias current for the CTLE so that the gain, gm*R, over PVT corners should be a constant. But due to non-ideal bias conditions and second-order effect at advanced technology nodes, using this technique becomes difficult to keep gain variation within a tolerable range over PVT corners.

According to principles described herein, a bias circuit is designed to mimic real bias conditions at which the CTLE circuit operates. Thus, as PVT conditions vary, the bias voltage produced by the bias structure will change to keep the gain of the CTLE substantially consistent across PVT corners. At the same time, a common-mode feedback (CMFB) circuit works to maintain the output common-mode voltage consistent as well. While the present description describes bias circuits for a CTLE circuit, it is understood that such bias circuits may be applied to other integrated circuit components as well.

For instance, in one example, a bias circuit is implemented as a current mirror, where one leg of the current mirror includes a first transistor, and the other leg of the current mirror includes a second transistor as well as a resistor. The first and second transistors are replicas of transistors in an equalizer circuit, and the resistor is a replica of a resistor in the equalizer circuit. For instance, the transistors in the bias circuit may be built to be a same size as transistors in the equalizer circuit and within a same semiconductor chip as the equalizer circuit. The same may be true for the resistor as well. Since the bias circuit and the equalizer are built on the same chip, it may be expected that their different components (e.g., transistors resistors, and the like) may experience similar process variation.

Furthermore, it may be expected that during normal operation, the transistors and resistors of both the bias circuit and the equalizer circuit may experience voltage and temperature ranges together. And because the different components are the same as or similar in structure, the effects of voltage and temperature should be common among like components.

The bias circuit may be built so that its gain (gm*R) may be the same as a gain of the equalizer circuit to which it provides a bias voltage. In one implementation, the bias circuit maintains a direct current (DC) operating point of its transistors over a range of voltages and temperatures, thereby providing a more precise bias control than would a similar bias circuit but does not maintain the DC operating point. For instance, the bias circuit may use operational amplifiers (op amps) to maintain drain voltages of its transistors at a stable reference voltage.

Continuing with the example of the bias circuit, it may provide a bias voltage to a current source in the equalizer circuit. By biasing the current source, the bias circuit maintains a gain of the equalizer constant, as again of the bias circuit itself is also constant.

Furthermore, various implementations include a common mode feedback circuit that operates to maintain a common mode voltage within the equalizer circuit. Specifically, some implementations include a circuit that biases a transistor within the equalizer, where the bias of the transistor determines a resistance of the transistor. The resistance of the transistor may adjust the common mode voltage over PVT to maintain the common mode voltage at a consistent level and at a same level experienced by a common mode voltage within the common mode feedback circuit.

Various implementations may include advantages over other systems. For instance, the bias circuit described herein may include increased precision by virtue of its control of its DC operating level. The increased precision of the bias circuit may lead to increased precision of the equalizer as well. Equalizer precision may be desirable because it may decrease a chance that a data bit is misread by downstream sampling circuitry. Additionally, various implementations may further increase precision by maintaining the common mode voltage to be constant throughout the range of voltages and temperatures.

FIG. 1 is an illustration of an example data transmitting and receiving system 100, according to one implementation. System 100 includes a transmitter 110, which has terminating impedance that matches a characteristic impedance of the transmission channel 120. Transmitter 110 receives high-speed, serialized digital data at its data input (labeled "Data") as a series of high and low voltage values. In this example, the signal is a differential signal having two parts (n and p).

Transmission channel 120 provides a data link between transmitter 110 and receiver 131, which includes equalizer 130 and deserializer 135. Transmission channel 120 may be embodied in any appropriate structure, for example, a cable, a metal trace on a printed circuit board, a metal wire connecting chips in a package, and the like. In FIG. 1, transmission channel 120 is shown as a transmission line in order to emphasize its similarities with transmission lines in general, including having a characteristic impedance as well as a Resistance-Capacitance (RC) time constant.

Equalizer 130 receives the transmitted data signal from transmission channel 120 and acts to reshape the received data signal, where the received data signal may be distorted due to transmission line reflections, RC attenuation, or other phenomena. Equalizer 130 is used by the system 100 to reshape the digital signal so that it is output from the equalizer 130 in a form that more closely matches the approximately square wave shape of the signal at the output of transmitter 110. After being reshaped by equalizer 130, signals go to deserializer 135, after which the serial high-speed data become parallel low speed output.

Digital circuitry 140 may include a flip-flop or other data recovery circuit to capture the values of the data signal as it appears at the data output ports of the receiver 131. Use of the equalizer circuit 132 to reshape the digital signal, including applying an appropriate gain, may reduce the risk of errors in capturing the data signal. As explained further below, equalizer 130 may provide a substantially constant gain over a range of process, voltage, and temperature.

Figure 2:
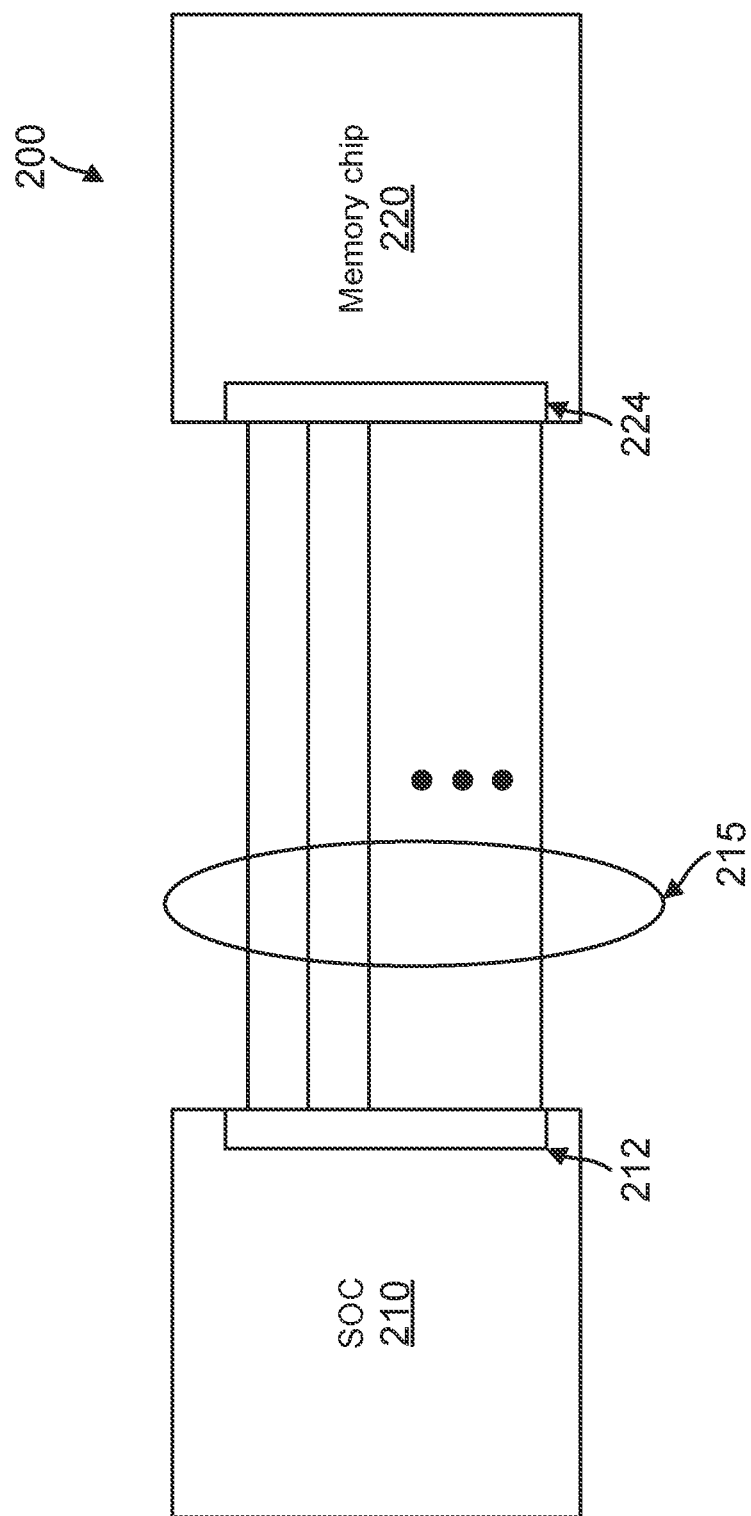
FIG. 2 is an illustration of an example chip-to-chip data transfer architecture, including multiple data transmitting and receiving circuits as in FIG. 1, according to one implementation.

FIG. 2 is an illustration of an example application of the signal transmission systems of FIGS. 1 and 3-5, according to one implementation. FIG. 2 illustrates a system 200 in which a system on a chip (SOC) 210 is in communication with a memory chip 220. SOC 210 communicates with memory chip 220 over transmission channels 215.

SOC 210 includes a multitude of processing units (not shown) implemented in a chip. The processing units may include any appropriate device, where examples include a mobile station modem, a multi-core central processing unit (CPU), a graphics processing unit (GPU), a digital signal processor (DSP), a 802.11x modem, and/or the like. In some examples, SOC 210 is specifically made for a mobile device, such as a smart phone, such that the processing units are designed for low power consumption. However, the scope of implementations is not limited to any specific SOC architecture.

Memory chip 220 in this example includes any appropriate memory chip for use in a computing device with SOC 210. Examples include a Static Random Access Memory (SRAM) chip, a Dynamic Random Access Memory (DRAM) chip, a Synchronous Dynamic Random Access Memory (SDRAM), and an electrically erasable programmable read-only memory (Flash memory) chip, although the scope of implementations is not limited to any particular memory chip. During a write operation, memory chip 220 receives data from SOC 210 over transmission channels 215, and a memory controller at memory chip 220 then stores that data in memory cells of the memory chip. During a read operation, memory chip 220 receives a read request for specific data from SOC 210, and the memory controller of memory chip 220 then accesses the data from various memory cells of the memory chip and transmits those bits of data to the SOC 210 over transmission channels 215.

The system of FIG. 2 may include implementations of the systems shown in FIGS. 1 and 3-5. In one example, system 200 of FIG. 2 is operated according to one or more DDR standards, where memory chip 220 is a DDR SDRAM chip.

Memory chip 220 includes a multitude of receiver circuits configured to receive data over respective transmission channels 215. It is expected that there would be many receivers and many transmitters at memory chip 220, so the transmitters and receivers are shown collectively at TX/RX circuit 224. Each one of the receiver circuits operates as described above with respect to FIGS. 1 and 3-5, including having an equalizer that operates as described with respect to method 800 of FIG. 8. Each one of the individual transmission channels 215 are the same as or similar to transmission channel 120 of FIG. 1, including having a characteristic impedance and a frequency response.

Similarly, SOC 210 also has a multitude of receiver circuits configured to receive data over respective transmission channels 215. Transmitters and receivers of SOC 210 are shown collectively in this example as TX/RX circuit 212. Each one of the receiver circuits operates as described above with respect to FIGS. 1 and 3-5, including having an equalizer that operates as described with respect to method 800 of FIG. 8. Although not described in detail herein, it is understood that the transmitter circuits in each of TX/RX circuits 212 and 224 may have a similar structure and operates similarly to transmitter circuit 110 of FIG. 1.

Figure 3:
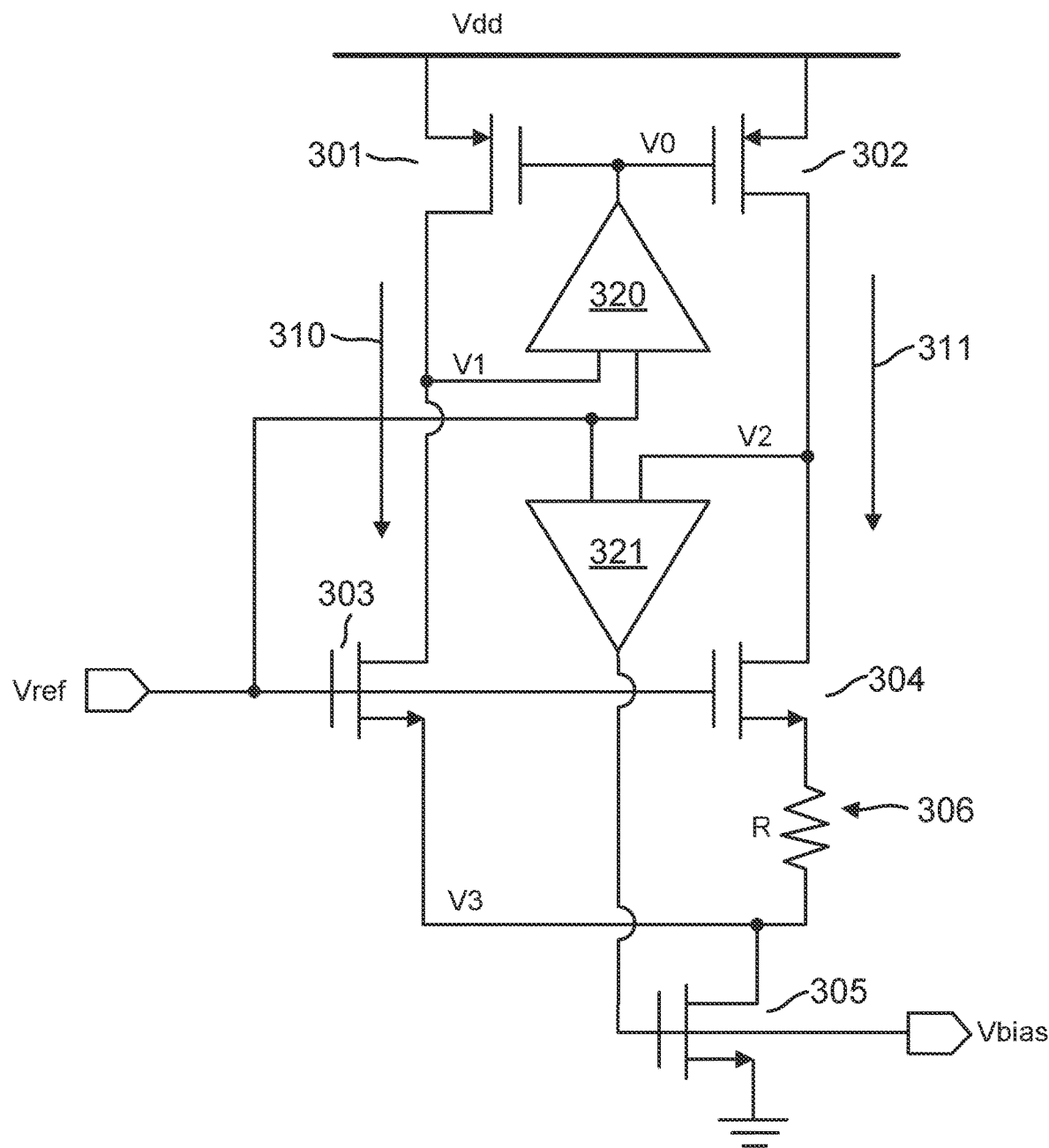
FIG. 3 is an illustration of an example bias generator that may perform a method according to various implementations.

FIG. 3 illustrates a bias circuit 300 according to one implementation. According to the present example, the structure includes a first op amp 320 and a second op amp 321. The first op amp 320 receives as inputs a reference voltage Vref voltage and voltage v1. The voltage v1 is applied to a drain of transistor 301 and the drain of transistor 303. The op amp 320 outputs voltage v0, which is applied to the gates of both transistors 301, 302. The inputs of op amp 321 are the reference voltage Vref and voltage v2 at a node coupling the drains of transistors 302 and 304. The source of transistor 304 is coupled to a resistor 306. Resistor 306 is positioned between the source of transistor 304 and the drain of transistor 305. The source of transistor 303 is coupled to the drain of transistor 305 as well.

The gate of transistor 305 is coupled to the output of op amp 321, the voltage of which is referred to as bias voltage Vbias. Transistor 305 is also referred to as a current source in this example. The current from its source to its drain equals current 310 plus 311, which is dependent upon the gate voltage Vbias.

The bias circuit 300 forms a current mirror having two legs. Therefore, current 310 mirrors current 311, so the currents 310 and 311 are approximately the same in this implementation. The op amps 320, 321 are arranged so that voltages v1 and v2 are held to be the same as Vref. The result is that the DC operating point of transistor 303 is held constant over a range of voltages and temperatures. For instance, as the voltage may change or as a temperature may change, the performance of transistors 303 and 304 may change, and even the resistance of resistor 306 may change. Nevertheless, voltages v1 and v2 are maintained constant, and even though the currents 310 and 311 may change over temperature and voltage, the transconductance of transistor 303 multiplied by the resistance of resistor 306 stays constant as does the DC operating point of transistor 303.

Over the range of temperatures and voltage, as currents 310, 311 may change and the resistance of resistor 306 may change, the bias may change as well. As current 310 increases, so does current 311, and Vbias decreases by virtue of the feedback between the output of op amp 320 and its input at v1 as well as the feedback at the output of op amp 321 and its input at v2. The reverse is true as well—as currents 310 and 311 decrease, Vbias increases. Therefore, Vbias is used as an adaptive bias control, based on feedback, to maintain a gain of the equalizer circuit 400 of FIG. 4 constant.

Transistor 303 is designed to mimic the transistor 403 in FIG. 4, as explained in more detail below. The gate, source, and drain voltages of transistor 303 are biased by op amps 320, 321 at the same values as the transistor 403. Vref is the target/designed common-mode voltage, and it may be provided by a stable voltage source, such as a bandgap generator. VDD in this example includes a voltage from a power rail. Vref may be, for example, VDD-220 mV, though the scope of implementations is not limited to any particular value.

Using the proposed bias structure, the transconductance of transistor 303 multiplied by the resistance of resistor 306 is constant. The bias voltage, Vbias, is generated and applied to current source 405 of FIG. 5. An advantage is that a gain variation may be controlled within 1 dB range over PVT corners within the equalizer circuit 400 of FIG. 4, as explained in more detail below.

Figure 4:
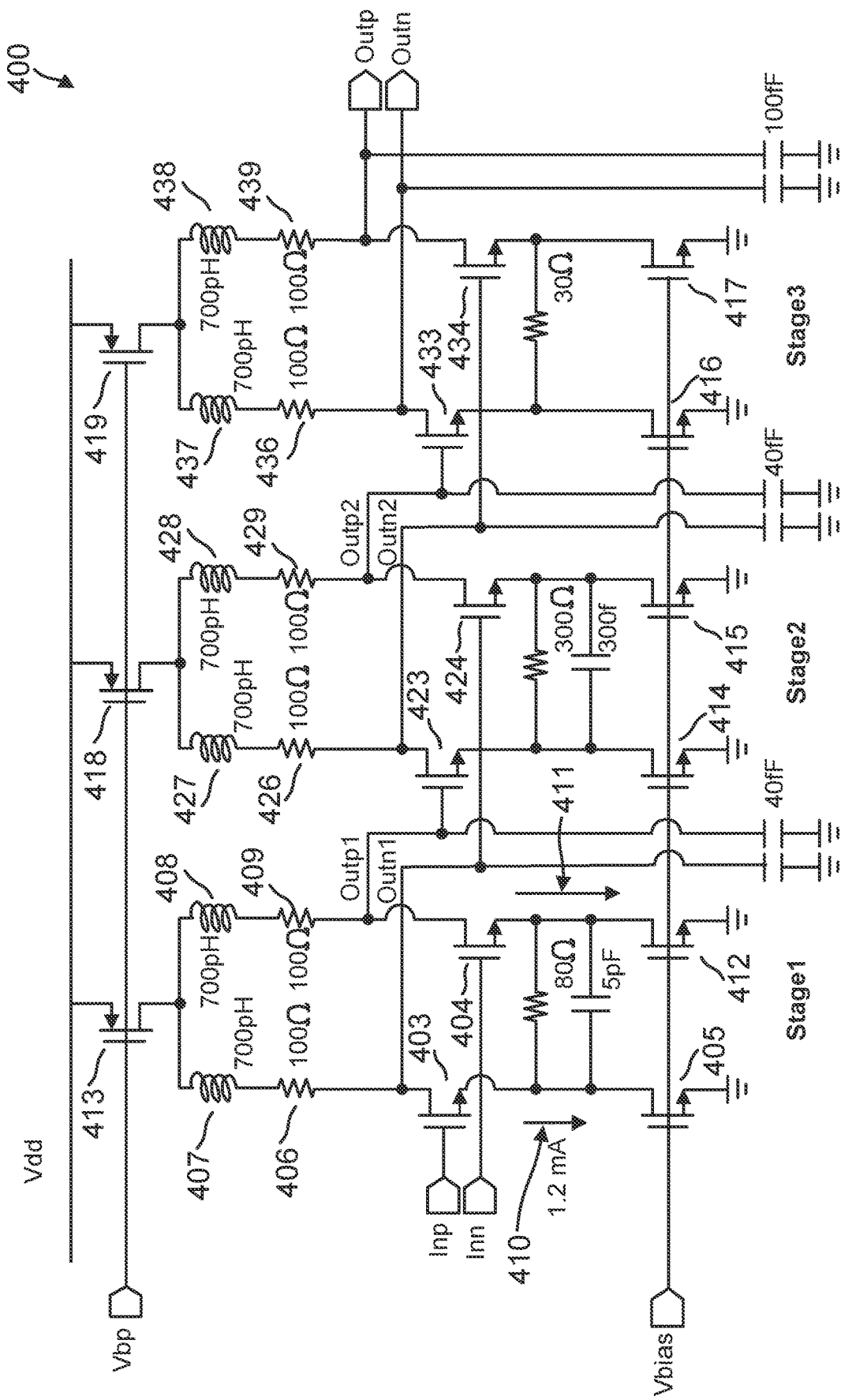
FIG. 4 is an illustration of an example continuous-time linear equalizer that may utilize a bias current from the bias current generator of FIG. 3, according to one implementation.

FIG. 4 is an illustration of an example continuous time linear equalizer (CTLE) 400, adapted according to one implementation. Equalizer circuit 400 has a three-stage design, with each of the stages (Stages 1-3) being approximately the same. Therefore, inductors 427, 428, 437, 438 are substantially the same as inductors 407, 408; resistors 426, 429, 436, 439 are substantially the same as resistors 406 and 409; transistors 423 and 433 are substantially the same as transistor 403; transistors 424, 434 are substantially the same as transistor 404; transistors 425, 422, 435, 432 are substantially the same as transistors 405, 412.

Differences between the stages include the impedances between the sources of the transistors 403/404, 423/424, 433/434. For instance, the sources of transistors 403 and 404 are coupled by a RC impedance including an 80Ω resistor and a 5 pF capacitor, whereas the other Stages 2 and 3 have differently-sized impedance components placed similarly.

It should be noted that FIG. 4 provides specific values for resistances, capacitances, inductances, currents, and the like, and those values are for example only. Other implementations may use different values as appropriate to achieve desirable equalization. Furthermore, other implementations may use a different number of stages in an equalizer, and any one or more of the stages may be adapted according to the principles described herein to provide a stable gain over PVT.

Equalizer circuit 400 receives a differential data signal Inn, Inp and outputs a reshaped data signal Outn, Outp, which may then be deserialized and latched. The equalizer circuit 400 applies again to the signal, which at Stage 1 is equal to the transconductance of transistor 403 multiplied by the resistance of resistor 406 (i.e., gm*R). The bias circuit of FIG. 3 provides the bias voltage Vbias, which operates to maintain gm*R constant over voltage and temperature. In fact, the other Stages 2-3 have substantially the same bias condition as Stage 1, so that each state has a constant gain.

Looking at Stage 1 first, it includes a current mirror having two legs. The first leg includes inductor 407, resistor 406, transistor 403, and transistor 405. The second leg includes inductor 408, resistor 409, transistor 404, and transistor 412. The current 410 mirrors the current 411, and thus the magnitudes of the currents 410, 411 are substantially equal in this implementation.

Transistor 303 is a replica of transistor 403. In other words, in this implementation, transistors 303 and 403 are built on the same semiconductor chip and have the same nominal characteristics. It is assumed that any process variation affecting transistor 403 would also affect transistor 303. Similarly, transistor 304 is a replica of transistor 404, transistor 305 is a replica of transistor 405 (both referred to herein as current sources), and resistor 306 is a replica of resistor 406. Because of this replication, the components of bias circuit 300 of FIG. 3 are assumed to operate under the same or similar PVT conditions as are the components of each of the stages of equalizer circuit 400.

The bias voltage Vbias is adjusted up or down depending on PVT variation within bias circuit 300 and, thus, an adjusted Vbias is provided to the current sources 405 and 412 in Stage 1 to adjust currents 410, 411. The adjustments to the currents 410, 411 adjust the transconductance of transistor 403 to maintain the gain constant across that range of PVT variation. Specifically, the transconductance of transistor 403 is adjusted so that the transconductance of transistor 403 times the resistance of resistor 406 (i.e., gm*R) is maintained constant as well, even as the resistance of resistor 406 may vary over PVT. The bias voltage is applied to the current sources 414-417 of Stages 2-3 similarly to maintain the gm*R of Stages 2-3 in the same manner.

Figure 5:
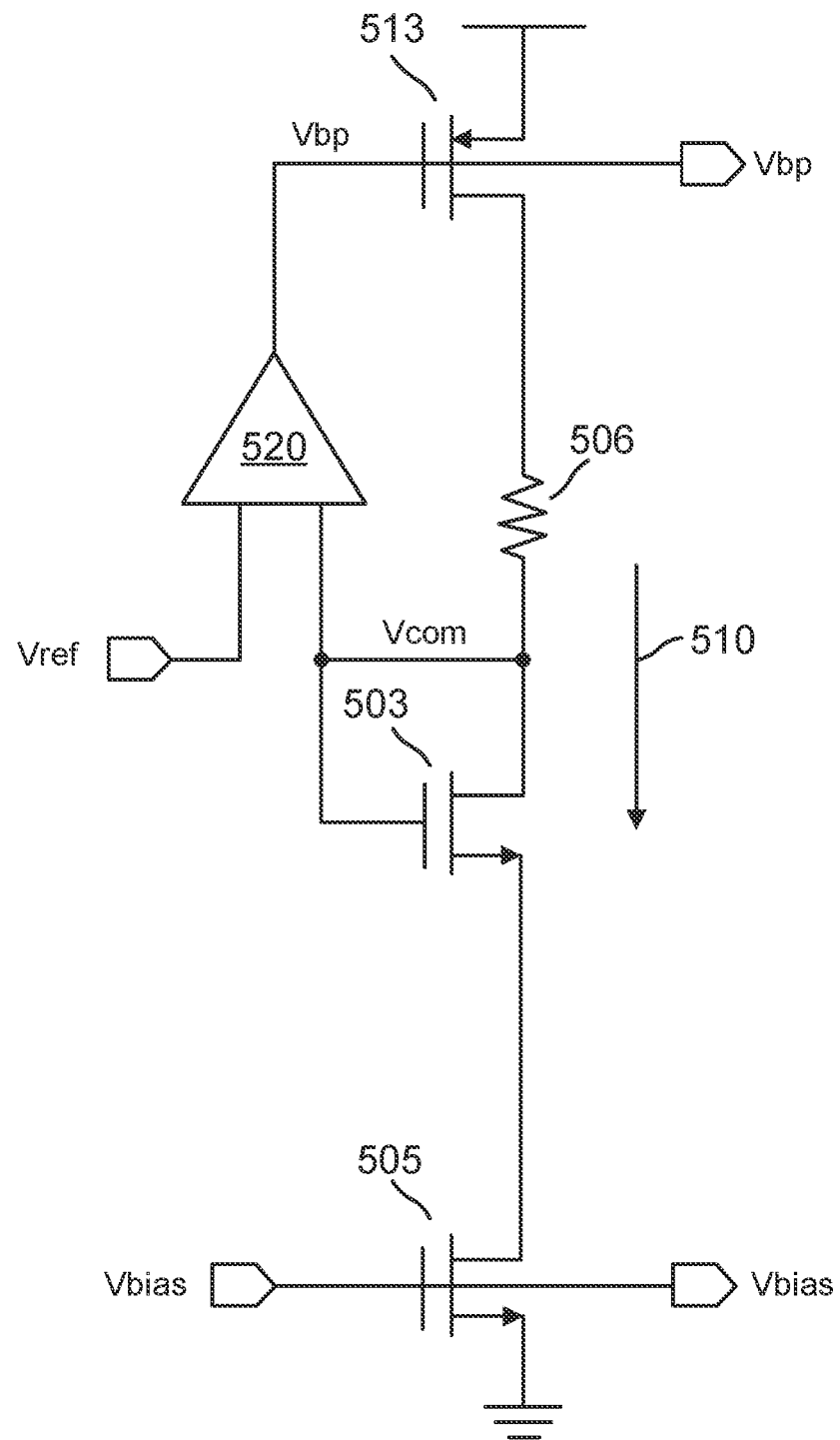
FIG. 5 is an illustration of an example bias generator that may be used with the equalizer of FIG. 4, according to one implementation.

FIG. 5 is an illustration of another example bias circuit 500, according to one implementation. Bias circuit 500 adjusts a resistance of transistor 413 of FIG. 4 by adjusting the voltage Vbp according to the feedback loop illustrated in FIG. 5.

In the example of FIG. 5, transistor 513 is a replica of transistor 413 of FIG. 4. Similarly, resistor 506 is a replica of resistor 406, transistor 503 is a replica of transistor 403, and current source 505 is a replica of current source 405. The voltage Vcom is a replica of the common mode voltage of Stage 1 of the equalizer circuit 400. Specifically, in the equalizer circuit 400 the common mode voltage is equal to Vdd minus the product of the current 410 and the resistance of the resistor 406. Any resistance from transistor 413 may be added to the resistance of resistor 406 for the purpose of calculating the common mode voltage of Stage 1. Bias circuit 500 generates Vbp to adjust the resistance of transistor 413 so that the product of the current 410 and the resistance is constant.

Looking at bias circuit 500, op amp 520 is arranged so that it receives Vref at one input and Vcom at the other, thereby forcing Vcom to be equal to Vref. As temperature and voltage changes during operation, the resistance value of resistor 506 may change, as may the operating parameters of any of transistors 503, 505, 513. As a result of such changes, the feedback loop of bias circuit 500 changes a resistance value of transistor 513 to either increase or decrease the current 510. The feedback loop of bias circuit 500 changes the resistance value of the transistor 513 by adjusting the gate voltage Vbp.

The voltage Vbp is applied to the transistor 413 of FIG. 4 to adjust its resistance in the same manner as the resistance of transistor 513 is adjusted. The result is that the common mode voltage of Stage 1 of equalizer circuit 400 is maintained substantially constant even over a range of voltages and temperatures and in spite of any process variations that may also affect the bias circuits 300 and 500. By keeping the common mode voltage in Stage 1 constant, bias circuit 500 ensures that the behavior of the transistors 303, 304 replicates the behavior of transistors 403, 404 so that Vbias adjustments maintain gm*R constant.

Similarly, the voltage Vbp is also applied to the transistors 418 and 419 of equalizer circuit 400. Vbp, therefore, adjusts common mode voltages at Stages 2-3 in the same way as in Stage 1 in order to keep gain constant across the Stages 1-3.

The implementation of FIG. 5 provides advantages over other Common Mode Feedback (CMFB) designs. For instance, a CMFB design may tune a bias current, which is multiplied by resistance to obtain a target common-mode voltage. But because the transconductance is determined by bias current, the gain can change even though constant common-mode is obtained. By contrast, implementations described herein may maintain both a common mode and a gain substantially constant. A different technique may include adding some bleeding current at the drain of differential pairs. By tuning the bleeding current, a constant common-mode is obtained without affecting the gain. However, this may consume more power and more output parasitics are introduced versus the bias circuit 500. Using principles described herein with respect to FIGS. 3-5, these challenges can be overcome, and both the gain and the common mode voltage can remain substantially consistent at different PVT corners without adding parasitics or wasting current by bleeding.

Figure 6:
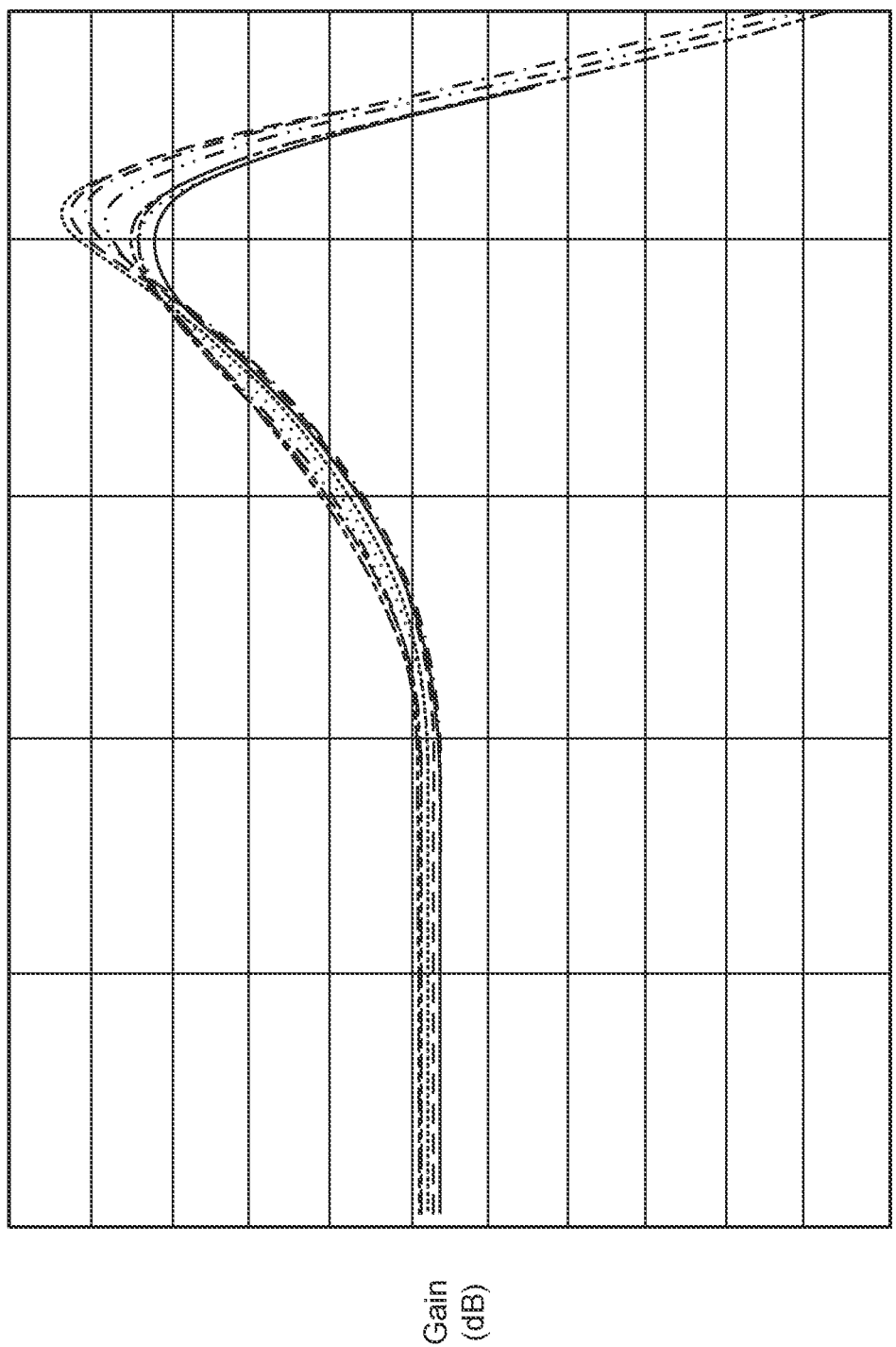
FIG. 6 illustrates improvement in consistent gain at different PVT corners at various frequencies, according to one implementation.

FIG. 6 illustrates gain of a CTLE device over various frequencies at various PVT corners, with an implementation of the bias circuit 300 working in coordination with the equalizer circuit 400, according to one implementation. FIG. 6 is based on simulation. Each of the lines within FIG. 6 represents gain across different PVT corners. As can be seen, variation among the lines is low and may be acceptable for some applications in which gain variation over PVT is sought to be minimized.

Figure 7:
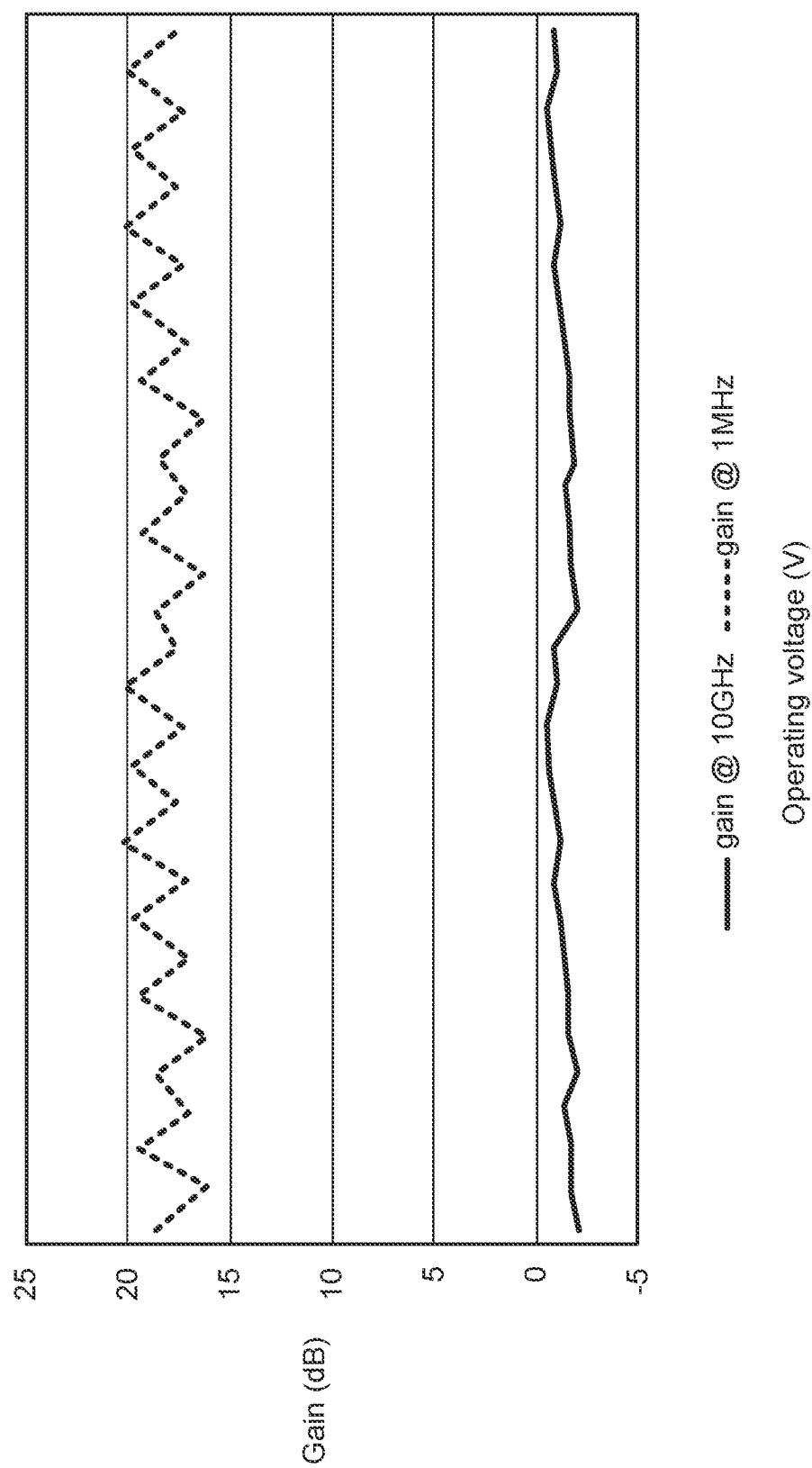
FIG. 7 illustrates improvement in consistent gain at different PVT corners, according to one implementation.

FIG. 7 illustrates the gain across different voltages at two different frequencies 1 MHz and 10 GHz, with an implementation of the bias circuit 300 working in coordination with the equalizer circuit 400, according to one implementation. FIG. 7 is based on simulation. As can be seen, gain variation is low and may be acceptable for some applications in which gain variation over PVT is sought to be minimized.

Figure 8:
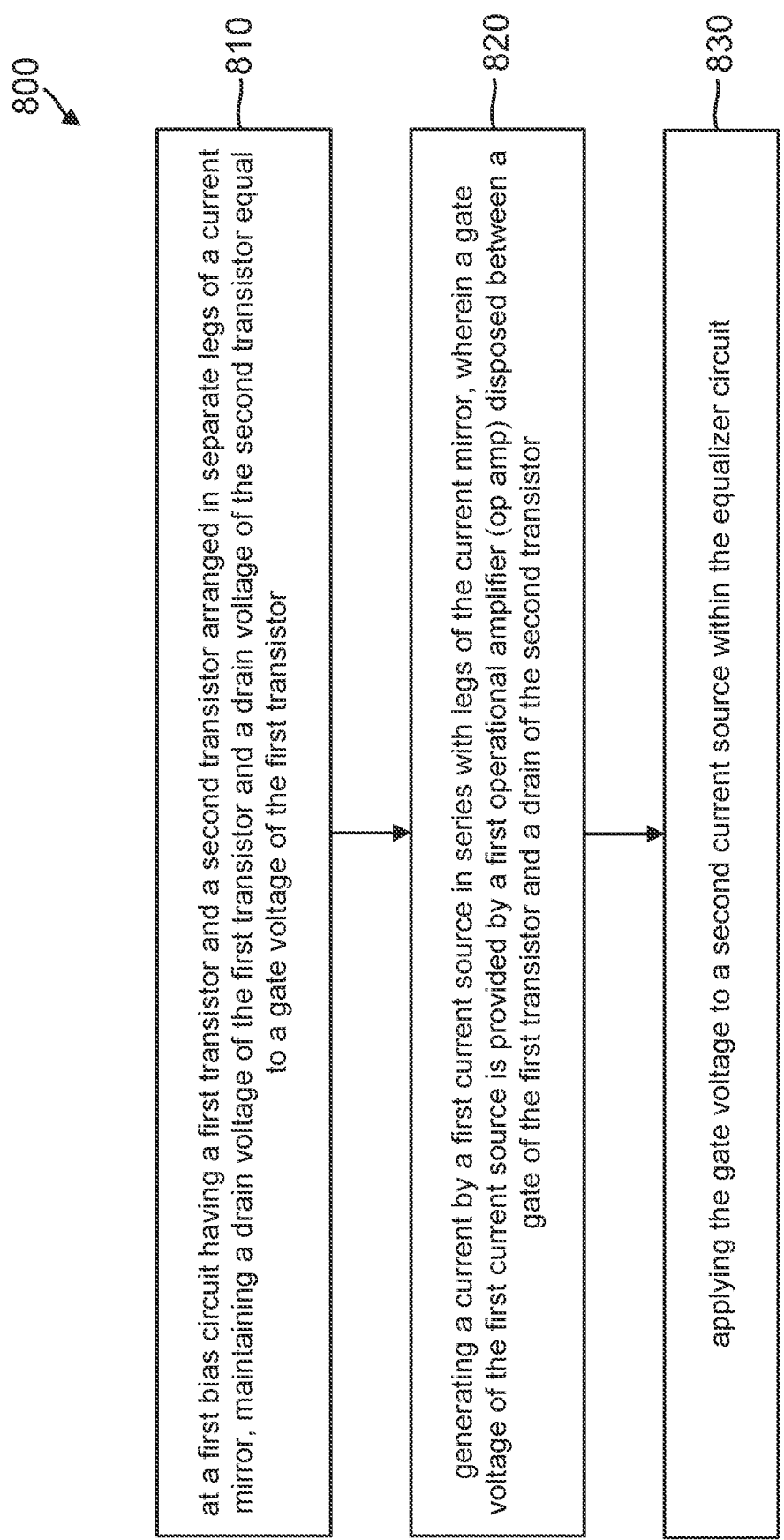
FIG. 8 is an illustration of an example method of operating an equalizer, such as the equalizer of FIG. 4, according to one implementation.

FIG. 8 is an illustration of a method 800 for operating an equalizer according to one implementation. For instance, FIG. 8 may be performed by the circuits shown in FIGS. 3-5, as bias circuits 300 and 500 maintain a gain of equalizer circuit 400 substantially constant over a range of PVT.

Action 810 includes maintaining a drain voltage of a first transistor and a drain voltage of a second transistor equal to a gate voltage of a first transistor within a bias circuit. An example is shown in FIG. 3, in which the drain voltage of transistor 303 and the drain voltage of transistor 304 are forced to a same voltage level using op amps 320, 321. Furthermore, the drain voltages are forced to a same voltage level as a reference voltage, Vref. In some examples, Vref may be provided by a bandgap generator or other stable voltage generator to be constant over a range of voltages and temperatures. A value of Vref may be set so that it is expected to keep the gate voltages of transistor 303, 304 at an appropriate level, even if the transconductance of either or both of transistors 303, 304 may change over the operating voltage and temperature range.

In the example of FIG. 3, transistors 303 and 304 are arranged in separate legs of a current mirror, where both of those legs are in series with a current source 305. At action 820, the bias circuit generates a current by a first current source that is in series with the legs of the current mirror. In this example, a gate voltage of the current source is provided by an op amp disposed between a gate of the first transistor and a drain of the second transistor.

In the example of FIG. 3, the current source 305 generates a current that is affected by its gate voltage, Vbias. Op amp 321 has inputs at the gate of the transistor 303 and the drain of the transistor 304 and an output providing Vbias to the gate of the current source 305. In the architecture of FIG. 3, coupling one of the op amp inputs to the drain of the transistor 304 creates a feedback loop so that Vbias decreases as the currents 310, 311 increase and increase as the currents 310, 311 decrease.

At action 830, the bias circuit applies the gate voltage to another current source within the equalizer circuit. For instance, in the example of FIG. 4, the bias voltage Vbias is provided to the current source 405, which is replicated by current source 305 of FIG. 3. Vbias is also provided to the other current source 412 in the other current mirror leg of Stage 1 of the equalizer circuit 400. Similarly, Vbias is also provided to the current sources 414-417 of Stages 2-3 of the equalizer circuit 400.

In the example method 800, the arrangement of op amps 320, 321 maintains the transconductance times resistance (gm*R) of the bias circuit 300 substantially constant across the range of operating voltages and temperatures. It is also tolerant to some amount of process variation because the transistors 303, 304 and the resistor 306 are built on a same chip as the equalizer circuit having transistors 403, 404 and resistor 406, so similarity in process variation is expected. The result of the arrangement of op amps 320, 321 is that the bias voltage Vbias may change adaptively either up or down in response to changes in the currents 310, 311 to keep gm*R constant in bias circuit 300 as well as in Stages 1-3 of equalizer circuit 400.

The scope of implementations is not limited to the actions 810-830 shown in FIG. 8. Rather, various implementations may add, omit, modify, or rearrange one or more actions. For instance, method 800 may further include operations attributable to bias circuit 500 of FIG. 5. Specifically, method 800 may further include adjusting an additional bias voltage to cause an adjustment in a resistive component (e.g., transistors 413, 418, 419) to maintain a common mode voltage constant. For instance, the bias circuit 500 may maintain the common mode voltage of the equalizer to be the same as a common mode voltage of bias circuit 500. In the example of FIG. 5, the common mode voltage is held constant by an op amp configured with a feedback loop to adjust an output of the op amp, where the output of the op amp is used as another bias voltage. The result is that the equalizer may maintain gm*R constant with more precision than if the common mode voltage was allowed to vary.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A receiver circuit comprising:
   an analog equalizer including a first transistor in series with a first resistor and with a first current source; and
   a bias circuit including a second transistor in series with a second current source, the bias circuit further including a second resistor between the second current source and a third transistor, a first operational amplifier (op amp) having a first input coupled to a gate of the second transistor and a second input coupled to a drain of the third transistor, a second op amp having a third input coupled to a gate of the second transistor and a fourth input coupled to a drain of the second transistor, an output of the first op amp providing a gate voltage to the first current source and to the second current source.

2. The receiver circuit of claim 1, further comprising:
an additional bias circuit having a third op amp providing a gate voltage for a fourth transistor and receiving a reference voltage and feedback voltage from the fourth transistor, wherein the gate voltage for the fourth transistor is provided to a fifth transistor, which is in series with the first transistor and the first current source.

3. The receiver circuit of claim 1, wherein the second transistor is a replica of the first transistor, and wherein the second current source is a replica of the first current source.

4. The receiver circuit of claim 1, wherein the second resistor comprises a replica of the first resistor.

5. The receiver circuit of claim 1, wherein the gate of the second transistor is coupled to an output of a bandgap voltage generator.

6. The receiver circuit of claim 1, wherein the first transistor includes a gate coupled to a data input from a transmission line.

7. The receiver circuit of claim 1, wherein the first transistor and the first current source are part of a first leg of a current mirror having a second leg, wherein the first leg is coupled to a first part of a differential data signal, and wherein the second leg is coupled to a second part of the differential data signal.

8. The receiver circuit of claim 1, wherein the first transistor is disposed between the first resistor and the first current source.

9. The receiver circuit of claim 1, wherein the first current source is disposed between the first transistor and ground.

10. The receiver circuit of claim 1, wherein the bias circuit includes a current mirror, and wherein the second transistor is disposed within a first leg of the current mirror and the third transistor and the second resistor are disposed within a second leg of the current mirror, further wherein the second current source is disposed between the second resistor and ground.

11. A method for operating an equalizer circuit, the method comprising:
at a first bias circuit having a first transistor and a second transistor arranged in separate legs of a current mirror, maintaining a drain voltage of the first transistor and a drain voltage of the second transistor equal to a gate voltage of the first transistor;
generating a current by a first current source in series with legs of the current mirror, wherein a gate voltage of the first current source is provided by a first operational amplifier (op amp) disposed between a gate of the first transistor and a drain of the second transistor;
applying the gate voltage to a second current source within the equalizer circuit;
maintaining a transconductance times resistance (gm*R) of the first bias circuit constant over a range of process corners, operating voltages and operating temperatures; and
maintaining a gm*R of the equalizer circuit to be equal to the gm*R of the first bias circuit.

12. The method of claim 11, further comprising:
at a second bias circuit, generating a bias voltage for a gate of a third transistor within the equalizer circuit, wherein generating the bias voltage includes maintaining a common mode voltage of the equalizer circuit to be the same as a common mode voltage of the second bias circuit.

13. A semiconductor chip comprising:
a first bias circuit having a first transistor and a second transistor arranged in a first current mirror, the first bias circuit further having a first current source coupled to the first transistor and the second transistor, the first bias circuit further having a first operational amplifier (op amp) coupled to a drain of the second transistor and a gate of the first transistor and coupled to output a first bias voltage to a gate of the first current source;
a second bias circuit having a second op amp coupled to output a second bias voltage to a gate of a third transistor; and
an equalizer circuit having a fourth transistor and a fifth transistor are arranged in a second current mirror, the fourth transistor being in series with a second current source, the second current mirror coupled to a power rail by a sixth transistor, wherein the second current source is coupled to the first bias voltage, and wherein the sixth transistor is coupled to the second bias voltage.

14. The semiconductor chip of claim 13, comprising a system on chip (SOC) having a multi-core processor configured to communicate with a memory chip via the equalizer circuit.

15. The semiconductor chip of claim 13, comprising a memory chip configured to communicate with a system on chip (SOC) via the equalizer circuit.

16. The semiconductor chip of claim 13, wherein the first transistor is a replica of the fourth transistor, and wherein the first current source is a replica of the second current source.

17. The semiconductor chip of claim 13, wherein the fourth transistor includes a gate coupled to a data input from a transmission line.

18. The semiconductor chip of claim 13, wherein the fourth transistor and the second current source are part of a first leg of the second current mirror having a second leg, wherein the first leg is coupled to a first part of a differential data signal, and wherein the second leg is coupled to a second part of the differential data signal.

19. The semiconductor chip of claim 13, further comprising:
a first resistor coupled between the fourth transistor and the sixth transistor; and
a second resistor coupled between the second transistor and the first current source, wherein the second resistor is a replica of the first resistor.

20. The semiconductor chip of claim 13, wherein the third transistor is a replica of the sixth transistor.

21. The semiconductor chip of claim 13, further comprising a deserializer coupled to an output of the equalizer circuit.

22. A data receiver in a semiconductor chip, the data receiver comprising:
means for reshaping a differential data signal, including applying a gain to the differential data signal, wherein the gain equals a transconductance of a first transistor times a resistance;
means for adjusting a current through the first transistor, including means for applying a bias voltage to a current source in the reshaping means, wherein the bias voltage applying means includes:
a second transistor and a third transistor arranged in a current mirror architecture; and a first operational amplifier (op amp) coupled to a drain of the second transistor and to a gate of the third transistor and having a feedback loop configured to adjust the bias voltage; and means for deserializing the differential data signal.

23. The data receiver of claim 22, further comprising:

means for adjusting the resistance of the reshaping means.

24. The data receiver of claim 23, wherein the resistance adjusting means comprises:

means for maintaining a common mode voltage of the reshaping means.

25. The data receiver of claim 22, wherein the third transistor is a replica of the first transistor.

26. The data receiver of claim 22, wherein the bias voltage applying means further includes a second op amp coupled to a drain of the third transistor and to the gate of the third transistor.

* * * * *